United States Patent
Arai et al.

(10) Patent No.: US 6,358,132 B1
(45) Date of Patent: Mar. 19, 2002

(54) APPARATUS FOR GRINDING SPHERICAL OBJECTS

(75) Inventors: Kazuhisa Arai; Toru Takazawa, both of Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 09/551,203

(22) Filed: Apr. 17, 2000

(30) Foreign Application Priority Data

Apr. 27, 1999 (JP) .......................................... 11-119490

(51) Int. Cl.⁷ .............................................. B24B 21/16
(52) U.S. Cl. ...................... 451/296; 451/300; 451/302
(58) Field of Search .......................... 451/50, 300, 302, 451/296, 299

(56) References Cited

U.S. PATENT DOCUMENTS

| | | | | |
|---|---|---|---|---|
| 3,984,945 A | * | 10/1976 | Messerschmidt | 451/50 |
| 4,091,572 A | * | 5/1978 | Denning | 451/50 |
| 4,965,967 A | * | 10/1990 | London | 451/50 |
| 6,200,413 B1 | * | 3/2001 | Privitt et al. | 451/50 |

FOREIGN PATENT DOCUMENTS

JP 3-196963 A * 12/1991 .................. 451/50

* cited by examiner

Primary Examiner—M. Rachuba
(74) Attorney, Agent, or Firm—Rader, Fishman & Grauer, PLLC

(57) ABSTRACT

Disclosed is an apparatus for grinding spherical objects into an exact spherical shape. The sphere-reshaping apparatus comprises a grinding section equipped with means for grinding spherical objects, an inlet section equipped with means for feeding spherical objects to the grinding section and an outlet section equipped with means for taking out reshaped spherical objects from the grinding section. The inlet section, grinding section and outlet section communicate by transporting means. The transporting means comprises an endless carrier belt having a series of apertures made for accepting spherical objects and a drive for driving the endless carrier belt. In the grinding section an endless grinding belt runs parallel with the endless carrier belt in same or counter direction relative to the endless carrier belt at such a speed that causes spherical objects to rub on the grinding belt. A randomizer moves back and forth across the carrier and grinding belts to sandwich spherical objects between the randomizer and the grinding belt, thereby assuring deviation-free grinding of spherical objects.

6 Claims, 2 Drawing Sheets

APPARATUS FOR GRINDING SPHERICAL OBJECTS

BACKGROUND OF THE INVENTION

1. Field of the Invention

The present invention relates to an apparatus for grinding spherical objects into an exact spherical shape.

2. Related Arts

Semiconductor wafers are subjected to a series of proceedings to inscribe circuit patterns on their surfaces, and then, each semiconductor wafer is diced to provide many IC or LSI chips for use in a variety of electronic devices.

The manufacturing of such IC or LSI chips, however, is apt to encounter following problems:

(1) Wafers are sliced out of silicon ingots to be subjected to grinding, polishing, dicing and other machining processes. Almost all final products thus provided, however, are found to be defective, and only one percent of the final products is found to be permissible. Accordingly the yield rate relative to the raw material is surprisingly low.

(2) Transportation and machining of semiconductor wafers must be effected in the perfect dust-free condition. Installation of clean rooms, however, cost too much.

(3) Slicing machines, polishing apparatuses, diffusing furnaces, grinding apparatuses, steppers, dicing machines and other machines and apparatuses are used at each manufacturing step. These machines and apparatuses, however, can be used exclusively for one particular size of wafers, and must be changed for handling different sizes of wafers. Replacement, however, is inhibitively expensive;

(4) Semiconductor wafers are very thin and fragile.

In the hope of reducing all of these problems it has been proposed that blocks of semiconductor material be machined to provide a lot of spherical bodies and that circuit patterns be inscribed on the surface of each ball-shaped semiconductor body; the spherical shape is physically stable, and is effectively resistive to deformation, breaking or damage.

The practice of the proposed method requires use of an apparatus for reshaping and ball-shaped semiconductor bodies into an exact spherical shape.

SUMMARY OF THE INVENTION

To meet this demand an apparatus for reshaping spherical objects into an exact spherical shape according to the present invention comprises at least a grinding section equipped with means for grinding spherical objects, an inlet section equipped with means for feeding spherical objects to the grinding section and an outlet section equipped with means for taking out spherical objects from the grinding section, said inlet section, grinding section and outlet section communicating by transporting means.

The transporting means may comprise an endless carrier belt having a series of apertures made for accepting spherical objects and a drive for driving the endless carrier belt, and the means for grinding spherical objects may comprise an endless grinding belt running parallel with the endless carrier belt in same or counter direction relative to the endless carrier belt at such a speed that causes spherical objects to rub on the endless grinding belt on account of the relative speed difference between the grinding and carrier belts, a flat support for supporting slidably the grinding belt, and a randomizer capable of reciprocating across the endless carrier and grinding belts to sandwich spherical objects between the randomizer and the endless grinding belt, thereby assuring the deviation-free grinding of spherical objects.

Selected apertures of the endless carrier belt are loaded with spherical objects one by one, and the endless grinding belt may have a longitudinal sphere-reshaping groove made on its center line, the cross-section of the longitudinal groove having the precise arc shape of the exact spherical shape, thereby giving the exact spherical shape to the spherical objects partly fitted in the longitudinal groove.

The inlet section may include means for putting spherical objects in each and every aperture of the endless carrier belt, and the outlet section may include means for sucking and taking out spherical objects from each and every aperture of the endless carrier belt.

The endless grinding belt and the randomizer may have fine-pulverized grindstone stuck fast to their surfaces. The grinding section may include means for feeding fine-pulverized grindstone into the means for grinding spherical objects.

The spherical objects may be ball-shaped pieces of semiconductor material.

Other objects and advantages of the present invention will be understood from the following description of an apparatus for grinding spherical objects into an exact spherical shape according to one preferred embodiment of the present invention, which is shown in accompanying drawings.

DETAILED DESCRIPTION OF PREFERRED EMBODIMENT

Figure 1:
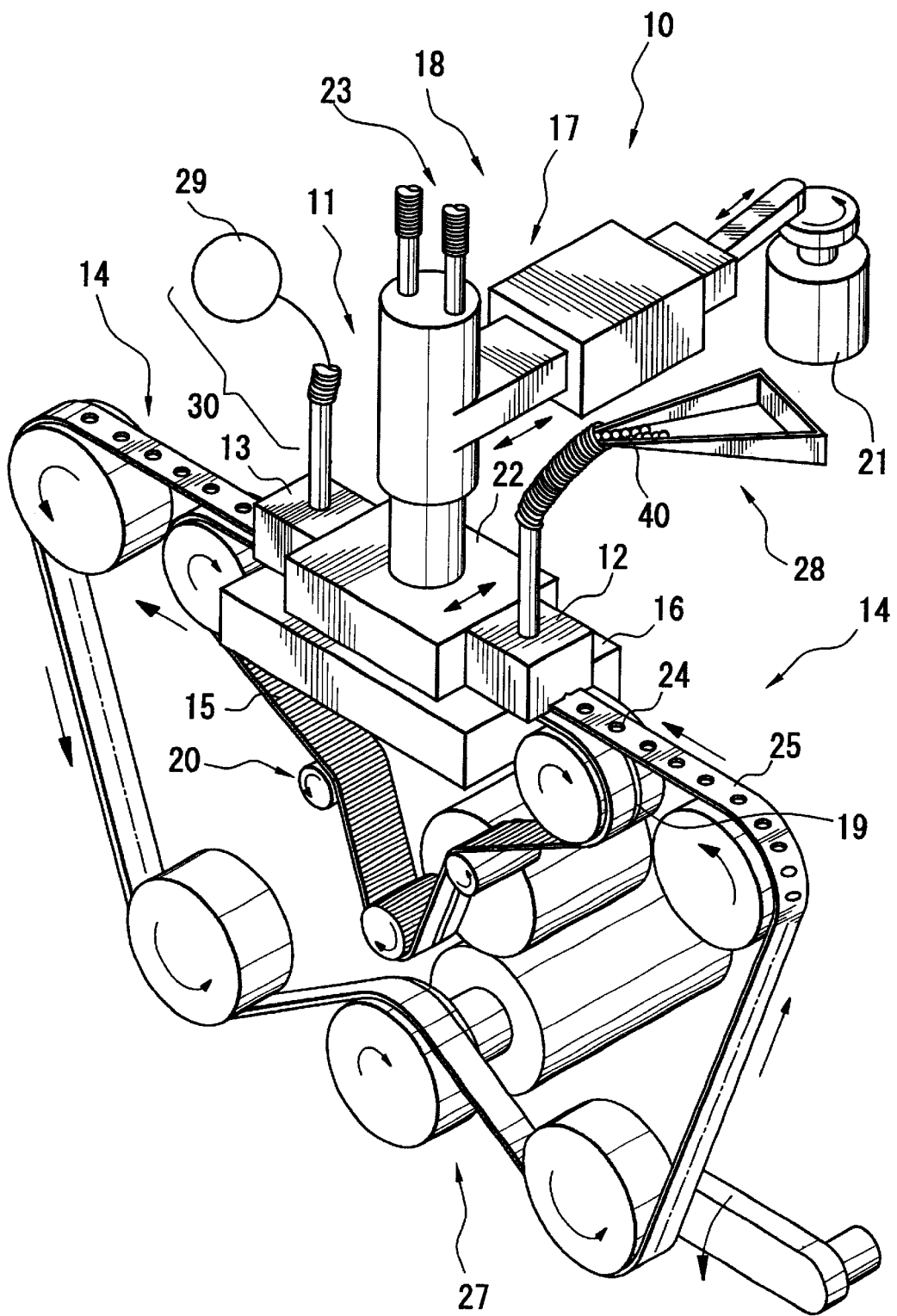
FIG.1 is a perspective view of the sphere-reshaping apparatus according to the present invention.
Figure 2:
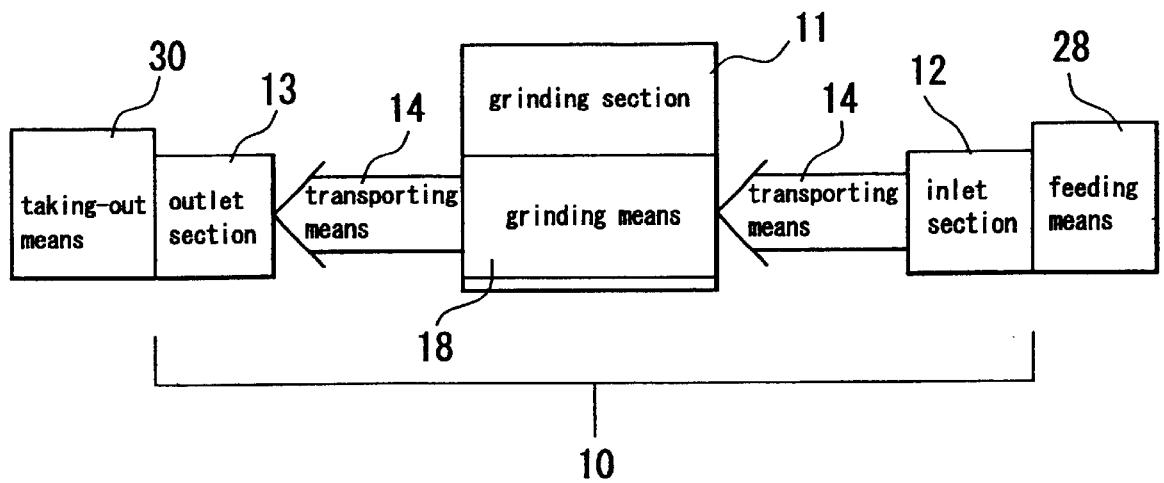
FIG.2 is a block diagram of the sphere-reshaping apparatus.

Referring to FIGS.1 and 2, an apparatus 10 for grinding spherical objects into a desired exact spherical shape according to the present invention comprises a grinding section 11 equipped with means 18 for grinding spherical objects, an inlet section 12 equipped with means 28 for feeding spherical objects into the grinding section 11 and an outlet section 13 equipped with means 30 for taking out spherical objects from the grinding section 11. The inlet section 12, the grinding section 11 and the outlet section 13 communicate by transporting means 14.

Referring to FIG.1, the transporting means 14 comprises an endless carrier belt 25 having a series of apertures 24 made for accepting spherical objects and a drive 27 including a plurality of pulleys for driving the endless carrier belt 25 while being tightly stretched.

In the grinding section 11 the grinding means 18 comprises an endless grinding belt 15 for rubbing spherical objects on its grinding surface, a flat support 16 for supporting slidably the endless grinding belt 15, and a movable randomizer 17 traversing the endless carrier belt 25 and the endless grinding belt 5, thus sandwiching spherical objects between the randomizer 17 and the endless grinding belt 15.

The grinding belt 15 has fine-pulverized grindstone stuck fast on its surface, and it has a longitudinal sphere-reshaping groove 19 made on its center line. The longitudinal groove 19 is, in cross-section, of exactly same arc shape as a selected circular part of the desired exact spherical shape, thereby giving the desired exact spherical shape to the spherical objects partly fitted in the sphere-reshaping groove 19. While being supported by the underlying flat surface 16 the grinding belt 15 is driven with the aid of motor-driven pulleys 20.

The movable randomizer 17 functions to rotate spherical objects all the time, thereby making their rubbing portions to change continuously, thereby making the whole surface of each spherical object to be ground evenly. Thus, the deviation-free grinding of spherical objects is assured. The randomizer 17 comprises a rotary drive 21, a randomizing block 22 and a pressure control 23. The rotary drive 21 makes the randomizing block 22 to move back and forth in a horizontal plane while riding on spherical bodies to push them against the grinding belt 15. Alternatively the randomizing block 22 may be rotated.

The flat bottom of the randomizing block 22 has a friction coefficient larger than that of the grinding belt 15. The randomizing block 22 may have pulverized grindstone stuck fast to its flat bottom, thereby attaining even more effective grinding in cooperation with the grinding belt 15.

In the inlet section 12 spherical objects are released from the feeding means 28 to the endless carrier belt 25 to be put in its apertures 24 one after another. In the outlet section 13 the taking-out means 30 includes a sucking source 29, which applies a negative pressure to each and every spherical object to draw reshaped spherical objects one after another.

Now, the manner in which the sphere-reshaping apparatus is used in grinding ball-shaped semiconductor bodies into an exact spherical shape is described.

The feeding means 28 stores ball-shaped semiconductor bodies 40, which are put in the apertures 24 of the carrier belt 25 to be brought to the grinding section 11. In the grinding section 11 the grinding belt 15 runs in one direction at a different speed relative to the carrier belt 25, which runs parallel to the underlying grinding belt 15. Thus, the resultant difference in speed allows the grinding belt 15 to rub the ball-shaped semiconductor bodies 40, which are fitted in the apertures 24 of the carrier belt 25. For example, the grinding belt 15 and the carrier belt 25 are driven in opposite directions to cause such relative difference in speed as required in rubbing ball-shaped semiconductor bodies, as indicated by arrows in FIG.3.

Figure 3:
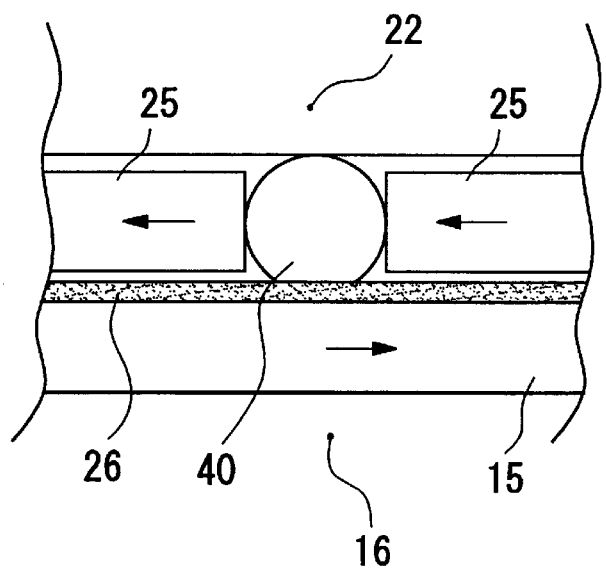
FIG.3 illustrates how a ball-shaped semiconductor body is grounded in the grinding section.

As seen from FIG. 3, the grinding belt 15 is slidably supported by the flat surface 16, so that the grinding belt 15 may run horizontally at a fixed level in stable fashion. The ball-shaped semiconductor bodies 40 fitted in apertures 24 of the carrier belt 25 are sandwiched rotatably between the overlying randomizing block 22 and the flat surface 16, thus allowing the ball-shaped semiconductor bodies 40 to rotate and rub on the grinding belt 15. The grinding belt 15 has a longitudinal sphere-reshaping groove 19 made on its center line. The cross-section of the longitudinal groove 19 is of the same shape as a selected arc of the exact spherical shape, thereby giving the exact spherical shape to the ball-shaped semiconductor bodies 40 partly fitted in the sphere-reshaping groove 19 by transferring the arc shape of the groove 19 to the ball-shaped semiconductor bodies with precision.

The friction coefficient of the lower surface of the randomizing block 22 is larger than that of the grinding belt 15, thus causing a rotating force to be applied to each ball-shaped semiconductor body 40 when the randomizing block 22 moves back and force across the grinding belt 15. The rotating force and the running of the endless carrier belt 25 make each ball-shaped semiconductor body 40 to rotate in the aperture 24 while changing its rotation axis all the time, thus assuring that the ball-shaped semiconductor body be ground evenly. The randomizing block 22 has fine-pulverized grindstone stuck fast on its lower surface, thereby permitting the randomizing block 22 to participate in grinding ball-shaped semiconductor bodies 40. In place of fast-sticking of fine-pulverized grindstone to the randomizing block 22 and/or the grinding belt 26 fine-pulverized grindstone may be fed to the grinding section 11. Additional feeding of fine-pulverized grindstone to the grinding section 11 may expedite the grinding of ball-shaped semiconductor bodies.

To assure the even grinding of ball-shaped semiconductor bodies 40 a controlled pressure to be applied to the randomizer 22 may be adjusted by the pressure control 23. Otherwise, the rising of the flat surface 16 toward the overlying randomizer 22 may be controlled for the purpose.

All the ball-shaped semiconductor bodies 40 thus evenly ground are carried by the endless carrier belt 25 to leave the grinding section 11 for the outlet section 13, where the taking-out means 30 sucks ball-shaped semiconductor bodies 40 to allow them to go out.

As may be understood from the above, spherical objects can be ground effectively with precision at an increased efficiency. Particularly ball-shaped semiconductor bodies can be ground with such precision that circuit patterns inscribed on their spherical surfaces are guaranteed to be free of any defects.

What is claimed is:

1. An apparatus for grinding spherical objects into an exact spherical shape comprising at least a grinding section equipped with means for grinding spherical objects, an inlet section equipped with means for feeding spherical objects to the grinding section and an outlet section equipped with means for taking out reshaped spherical objects from the grinding section, said inlet section, grinding section and outlet section communicating by transporting means, wherein said transporting means comprises an endless carrier belt having a series of apertures made for accepting and carrying therein spherical objects and a drive for driving the endless carrier belt;

said means for grinding spherical objects comprises an endless grinding belt separate from and positioned beneath the endless carrier belt wherein the endless grinding belt is parallel relative to the endless carrier belt and travels in either one of a same or counter direction relative to the endless carrier belt, a flat support positioned beneath the endless grinding belt to slidably support the endless grinding belt, and a randomizer positioned above the endless carrier belt that is capable of moving back and forth across the endless carrier and grinding belts to sandwich the spherical objects between the randomizer and the endless grinding belt.

2. An apparatus for grinding spherical objects into an exact spherical shape according to claim 1, wherein selected apertures of said endless carrier belt are loaded with spherical objects one by one; and said endless grinding belt has a longitudinal sphere-reshaping groove made on its center line, the cross-section of the longitudinal sphere-reshaping groove having the arc shape of the exact spherical shape, thereby giving the exact spherical shape to the spherical objects partly fitted in the sphere-reshaping groove.

3. An apparatus for grinding spherical objects into an exact spherical shape according to claim 2, wherein said inlet section includes means for putting spherical objects in each and every aperture of the endless carrier belt, and said outlet section includes means for sucking and taking out spherical objects from each and every aperture of the endless carrier belt.

4. An apparatus for grinding spherical objects into an exact spherical shape according to claim 1, wherein said endless grinding belt and said randomizer have fine-pulverized grindstone stuck fast on their surfaces.

5. An apparatus for grinding spherical objects into an exact spherical shape according to claim 4, wherein said grinding section has means for feeding fine-pulverized grindstone into the means for grinding spherical objects.

6. An apparatus for grinding spherical objects into an exact spherical shape according to any one of claims 1 to 5, wherein said spherical objects are ball-shaped pieces of semiconductor material.

* * * * *